(12) United States Patent
Shi et al.

(10) Patent No.: US 8,466,610 B2
(45) Date of Patent: Jun. 18, 2013

(54) LOW COST HIGH EFFICIENCY TRANSPARENT ORGANIC ELECTRODES FOR ORGANIC OPTOELECTRONIC DEVICES

(75) Inventors: Yijian Shi, Mountain View, CA (US); Qianfei Xu, Mountain View, CA (US)

(73) Assignee: SRI International, Menlo Park, CA (US)

( * ) Notice: Subject to any disclaimer, the term of this patent is extended or adjusted under 35 U.S.C. 154(b) by 17 days.

(21) Appl. No.: 13/319,324

(22) PCT Filed: May 13, 2010

(86) PCT No.: PCT/US2010/034804
§ 371 (c)(1),
(2), (4) Date: Feb. 2, 2012

(87) PCT Pub. No.: WO2010/132715
PCT Pub. Date: Nov. 18, 2010

(65) Prior Publication Data
US 2012/0299462 A1    Nov. 29, 2012

Related U.S. Application Data

(60) Provisional application No. 61/178,398, filed on May 14, 2009.

(51) Int. Cl.
*H05B 33/06* (2006.01)
*H05B 33/10* (2006.01)

(52) U.S. Cl.
USPC .............................. 313/498; 313/501; 445/58

(58) Field of Classification Search
CPC ..... H01L 21/76805; H05B 33/10; H05B 33/06
USPC ..................... 445/58; 313/498–512; 438/99; 257/40, 88
See application file for complete search history.

(56) References Cited

U.S. PATENT DOCUMENTS

| | | | |
|---|---|---|---|
| 7,652,302 B2 * | 1/2010 | Tsai et al. | 257/99 |
| 2006/0154389 A1 * | 7/2006 | Doan | 438/21 |
| 2009/0101886 A1 * | 4/2009 | Chang | 257/13 |

* cited by examiner

*Primary Examiner* — Tracie Y Green
(74) *Attorney, Agent, or Firm* — Richard Aron Osman; Isaac Rutenberg

(57) ABSTRACT

The disclosure provides methods and materials for decreasing the cost and increasing the efficiency of electroluminescent devices. The disclosure also provides electroluminescent devices prepared by such methods. In one embodiment, for example, there is provided a method for preparing an electroluminescent device comprising two metal electrodes, an electroluminescent layer, an optical/insulating layer, and a conductive layer, all of which are disposed on a transparent substrate. One of the electrodes is patterned, and the optical/insulating layer comprises vias to allow conduction between the patterned electrode and the conductive layer.

21 Claims, 9 Drawing Sheets

LOW COST HIGH EFFICIENCY TRANSPARENT ORGANIC ELECTRODES FOR ORGANIC OPTOELECTRONIC DEVICES

CROSS REFERENCE TO RELATED APPLICATIONS

This application claims priority under 35 U.S.C. §119 to U.S. Provisional Application Ser. No. 61/178,398, filed May 14, 2009, the contents of which is incorporated herein by reference in its entirety.

TECHNICAL FIELD

The present invention is directed to methods for increasing the variety of materials that may be used in the production of light emitting devices, as well as the devices produced by such methods. The invention finds utility, for example, in the field of electronic devices.

BACKGROUND

In certain embodiments of traditional organic light emitting diodes (OLEDs), two electrodes are separated by an electroluminescent layer. Because photons are generated within the electroluminescent layer by the recombination of electrons and electron holes, one of the electrodes is typically made from a transparent material to allow the emitted photons to escape the device. For example, a common transparent electrode material is indium tin oxide (ITO). The transparent conductive ITO electrodes widely used in OLED devices are typically 85-90% transparent and have approximately 10 ohm per square ($\Omega/\square$) sheet resistance. One major drawback of ITO electrodes consists of their high optical losses due to their high refractive index: optical losses are enhanced by the light reflections associated with the high refractive index of ITO relative to the transparent carrier substrate (generally glass in current OLED devices). This high optical loss has significantly reduced the external quantum efficiency (EQE) of OLED devices. A further drawback of using ITO is that the material is relatively expensive.

There remains a need in the art to overcome the abovementioned drawbacks, as well as generally to develop new methods and materials for manufacturing efficient and low cost organic electrical devices (OEDs) such as electroluminescent devices (ELDs). Ideal methods would utilize materials that are readily available or easily prepared, provide significant enhancements in device output (efficiency and/or total output), minimize the number of process steps, and/or provide highly reproducible results.

SUMMARY OF THE INVENTION

The present invention is directed to addressing one or more of the above-mentioned drawbacks, and in particular in providing methods and materials for preparing electroluminescent devices that do not require transparent electrodes.

In one aspect, there is provided an electroluminescent device comprising: a substrate comprising a transparent material; an optical layer comprising a transparent optical material, wherein the optical layer contacts the substrate; a first electrode contacting the substrate, the optical layer, or both the substrate and the optical layer; one or more vias forming channels through the optical layer to the first electrode; a conducting layer comprising a conducting material, wherein the conducting material at least partially fills the one or more vias such that the conducting material contacts the first electrode, and further wherein the conducting layer overlays the optical layer; an electroluminescent layer contacting the conducting layer; and a second electrode contacting the electroluminescent layer.

In another aspect, there is provided a method for forming an electroluminescent device. The method comprises: providing a transparent substrate; forming a patterned first electrode on the substrate; depositing an optical material over the patterned first electrode and substrate; forming a pattern of vias in the optical material by removing optical material such that a portion of the first electrode is exposed; depositing a conductive material over the optical material and in the vias such that the conductive material contacts the first electrode through the vias; depositing an electroluminescent material over the conducting material; and depositing a second electrode over the electroluminescent material.

In yet another aspect, there is provided a method for forming an electroluminescent device. The method comprises: providing a transparent substrate; depositing a first portion of optical material over the substrate; optionally forming a pattern within the optical material by removing a fraction of the optical material; forming a patterned first electrode on the first portion of optical material; depositing a second portion of optical material over the first portion and over the first electrode; forming a pattern of vias in the second portion of optical material by removing optical material such that a fraction of the first electrode is exposed through the vias; depositing a conductive material over the optical material and in the vias such that the conductive material contacts the first electrode through the vias; depositing an electroluminescent material over the conducting material; and depositing a second electrode over the electroluminescent material.

Other aspects of the invention will be apparent from the description that follows, including the claims and examples.

DETAILED DESCRIPTION OF THE DISCLOSURE

Figure 1A:
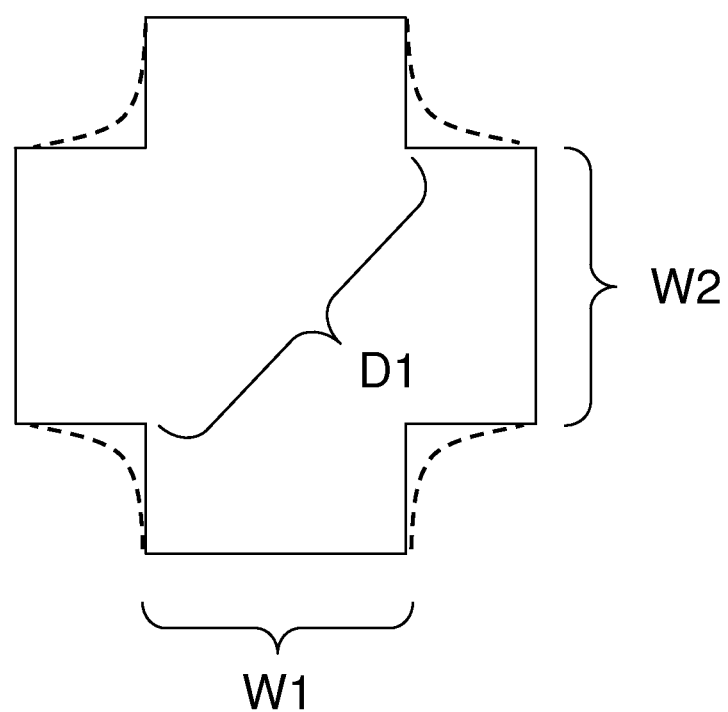
FIG. 1a provides a schematic representation of a point of intersection between two wires from a grid first electrode according to an embodiment of the disclosure.

It is to be understood that the terminology used herein is for the purpose of describing particular embodiments only, and is not intended to be limiting. The definitions provided herein are not meant to be mutually exclusive. For example, it will be appreciated that some chemical groups may fit into more than one definition.

The term "alkyl" as used herein refers to a branched or unbranched saturated hydrocarbon group typically although not necessarily containing 1 to about 24 carbon atoms, such as methyl, ethyl, n-propyl, isopropyl, n-butyl, isobutyl, t-butyl, octyl, decyl, and the like, as well as cycloalkyl groups such as cyclopentyl, cyclohexyl and the like. Generally, although again not necessarily, alkyl groups herein may contain 1 to about 18 carbon atoms, and such groups may contain 1 to about 12 carbon atoms. The term "lower alkyl" intends an alkyl group of 1 to 6 carbon atoms. "Substituted alkyl" refers to alkyl substituted with one or more substituent groups, and the terms "heteroatom-containing alkyl" and "heteroalkyl" refer to an alkyl substituent in which at least one carbon atom is replaced with a heteroatom, as described in further detail infra. If not otherwise indicated, the terms "alkyl" and "lower alkyl" include linear, branched, cyclic, unsubstituted, substituted, and/or heteroatom-containing alkyl or lower alkyl, respectively.

The term "alkenyl" as used herein refers to a linear, branched or cyclic hydrocarbon group of 2 to about 24 carbon atoms containing at least one double bond, such as ethenyl, n-propenyl, isopropenyl, n-butenyl, isobutenyl, octenyl, decenyl, tetradecenyl, hexadecenyl, eicosenyl, tetracosenyl, and the like. Generally, although again not necessarily, alkenyl groups herein may contain 2 to about 18 carbon atoms, and for example may contain 2 to 12 carbon atoms. The term "lower alkenyl" intends an alkenyl group of 2 to 6 carbon atoms. The term "substituted alkenyl" refers to alkenyl substituted with one or more substituent groups, and the terms "heteroatom-containing alkenyl" and "heteroalkenyl" refer to alkenyl in which at least one carbon atom is replaced with a heteroatom. If not otherwise indicated, the terms "alkenyl" and "lower alkenyl" include linear, branched, cyclic, unsubstituted, substituted, and/or heteroatom-containing alkenyl and lower alkenyl, respectively.

The term "alkynyl" as used herein refers to a linear or branched hydrocarbon group of 2 to 24 carbon atoms containing at least one triple bond, such as ethynyl, n-propynyl, and the like. Generally, although again not necessarily, alkynyl groups herein may contain 2 to about 18 carbon atoms, and such groups may further contain 2 to 12 carbon atoms. The term "lower alkynyl" intends an alkynyl group of 2 to 6 carbon atoms. The term "substituted alkynyl" refers to alkynyl substituted with one or more substituent groups, and the terms "heteroatom-containing alkynyl" and "heteroalkynyl" refer to alkynyl in which at least one carbon atom is replaced with a heteroatom. If not otherwise indicated, the terms "alkynyl" and "lower alkynyl" include linear, branched, unsubstituted, substituted, and/or heteroatom-containing alkynyl and lower alkynyl, respectively.

If not otherwise indicated, the term "unsaturated alkyl" includes alkenyl and alkynyl, as well as combinations thereof.

The term "alkoxy" as used herein intends an alkyl group bound through a single, terminal ether linkage; that is, an "alkoxy" group may be represented as —O-alkyl where alkyl is as defined above. A "lower alkoxy" group intends an alkoxy group containing 1 to 6 carbon atoms, and includes, for example, methoxy, ethoxy, n-propoxy, isopropoxy, t-butyloxy, etc. Substituents identified as "$C_1$-$C_6$ alkoxy" or "lower alkoxy" herein may, for example, may contain 1 to 3 carbon atoms, and as a further example, such substituents may contain 1 or 2 carbon atoms (i.e., methoxy and ethoxy).

The term "aryl" as used herein, and unless otherwise specified, refers to an aromatic substituent generally, although not necessarily, containing 5 to 30 carbon atoms and containing a single aromatic ring or multiple aromatic rings (such as 1 to 3 rings) that are fused together, directly linked, or indirectly linked (such that the different aromatic rings are bound to a common group such as a methylene or ethylene moiety). Aryl groups may, for example, contain 5 to 20 carbon atoms, and as a further example, aryl groups may contain 5 to 12 carbon atoms. For example, aryl groups may contain one aromatic ring or two fused or linked aromatic rings, e.g., phenyl, naphthyl, biphenyl, diphenylether, diphenylamine, benzophenone, and the like. "Substituted aryl" refers to an aryl moiety substituted with one or more substituent groups, and the terms "heteroatom-containing aryl" and "heteroaryl" refer to an aryl substituent, in which at least one carbon atom is replaced with a heteroatom, as will be described in further detail infra. If not otherwise indicated, the term "aryl" includes unsubstituted, substituted, and/or heteroatom-containing aryl substituents.

The term "aralkyl" refers to an alkyl group with an aryl substituent, and the term "alkaryl" refers to an aryl group with an alkyl substituent, wherein "alkyl" and "aryl" are as defined above. In general, aralkyl and alkaryl groups herein contain 6 to 30 carbon atoms. Aralkyl and alkaryl groups may, for example, contain 6 to 20 carbon atoms, and as a further example, such groups may contain 6 to 12 carbon atoms.

The term "olefinic group" intends a mono-unsaturated or di-unsaturated hydrocarbon group of 2 to 12 carbon atoms. Preferred olefinic groups within this class are sometimes herein designated as "lower olefinic groups," intending a hydrocarbon moiety of 2 to 6 carbon atoms containing a single terminal double bond. The latter moieties may also be termed "lower alkenyl."

The term "alkylene" as used herein refers to a difunctional saturated branched or unbranched hydrocarbon chain containing from 1 to 24 carbon atoms. "Lower alkylene" refers to alkylene linkages containing from 1 to 6 carbon atoms, and includes, for example, methylene (—$CH_2$—), ethylene (—$CH_2CH_2$—), propylene (—$CH_2CH_2CH_2$—), 2-methyl-propylene (—$CH_2$—$CH(CH_3)$—$CH_2$—), hexylene (—$(CH_2)_6$—) and the like.

The term "amino" is used herein to refer to the group —$NZ^1Z^2$ wherein $Z^1$ and $Z^2$ are hydrogen or nonhydrogen substituents, with nonhydrogen substituents including, for example, alkyl, aryl, alkenyl, aralkyl, and substituted and/or heteroatom-containing variants thereof.

The term "heteroatom-containing" as in a "heteroatom-containing alkyl group" (also termed a "heteroalkyl" group) or a "heteroatom-containing aryl group" (also termed a "heteroaryl" group) refers to a molecule, linkage or substituent in which one or more carbon atoms are replaced with an atom other than carbon, e.g., nitrogen, oxygen, sulfur, phosphorus or silicon, typically nitrogen, oxygen or sulfur. Similarly, the term "heteroalkyl" refers to an alkyl substituent that is heteroatom-containing, the term "heterocyclic" refers to a cyclic substituent that is heteroatom-containing, the terms "heteroaryl" and heteroaromatic" respectively refer to "aryl" and "aromatic" substituents that are heteroatom-containing, and the like. Examples of heteroalkyl groups include alkoxyaryl, alkylsulfanyl-substituted alkyl, N-alkylated amino alkyl, and the like. Examples of heteroaryl substituents include pyrrolyl, pyrrolidinyl, pyridinyl, quinolinyl, indolyl, furyl, pyrimidinyl, imidazolyl, 1,2,4-triazolyl, tetrazolyl, etc., and examples of heteroatom-containing alicyclic groups are pyrrolidino, morpholino, piperazino, piperidino, tetrahydrofuranyl, etc.

"Hydrocarbyl" refers to univalent hydrocarbyl radicals containing 1 to about 30 carbon atoms, including 1 to about 24 carbon atoms, further including 1 to about 18 carbon atoms, and further including about 1 to 12 carbon atoms, including linear, branched, cyclic, saturated and unsaturated species, such as alkyl groups, alkenyl groups, aryl groups, and the like. "Substituted hydrocarbyl" refers to hydrocarbyl substituted with one or more substituent groups, and the term "heteroatom-containing hydrocarbyl" refers to hydrocarbyl in which at least one carbon atom is replaced with a heteroatom. Unless otherwise indicated, the term "hydrocarbyl" is to be interpreted as including unsubstituted, substituted, heteroatom-containing, and substituted heteroatom-containing hydrocarbyl moieties.

"Halo" or "halogen" refers to fluoro, chloro, bromo or iodo, and usually relates to halo substitution for a hydrogen atom in an organic compound. Of the halos, chloro and fluoro are generally preferred.

By "substituted" as in "substituted hydrocarbyl," "substituted alkyl," "substituted aryl," and the like, as alluded to in some of the aforementioned definitions, is meant that in the hydrocarbyl, alkyl, aryl, or other moiety, at least one hydrogen atom bound to a carbon (or other) atom is replaced with one or more non-hydrogen substituents. Examples of such substituents include, without limitation: functional groups such as halo, hydroxyl, sulfhydryl, $C_1$-$C_{24}$ alkoxy, $C_2$-$C_{24}$ alkenyloxy, $C_2$-$C_{24}$ alkynyloxy, $C_5$-$C_{20}$ aryloxy, acyl (including $C_2$-$C_{24}$ alkylcarbonyl (—CO-alkyl) and $C_6$-$C_{20}$ arylcarbonyl (—CO-aryl)), acyloxy (—O-acyl), $C_2$-$C_{24}$ alkoxycarbonyl (—(CO)—O-alkyl), $C_6$-$C_{20}$ aryloxycarbonyl (—(CO)—O-aryl), halocarbonyl (—CO)—X where X is halo), $C_2$-$C_{24}$ alkylcarbonato (—O—(CO)—O-alkyl), $C_6$-$C_{20}$ arylcarbonato (—O—(CO)—O-aryl), carboxy (—COOH), carboxylato (—COO$^-$), carbamoyl (—(CO)—NH$_2$), mono-substituted $C_1$-$C_{24}$ alkylcarbamoyl (—(CO)—NH($C_1$-$C_{24}$ alkyl)), di-substituted alkylcarbamoyl (—(CO)—N($C_1$-$C_{24}$ alkyl)$_2$), mono-substituted arylcarbamoyl (—(CO)—NH-aryl), thiocarbamoyl (—(CS)—NH$_2$), carbamido (—NH—(CO)—NH$_2$), cyano (—C≡N), isocyano (—N$^+$≡C$^-$), cyanato (—O—C≡N), isocyanato (—O—N$^+$≡C$^-$), isothiocyanato (—S—C≡N), azido (—N=N$^+$=N$^-$), formyl (—(CO)—H), thioformyl (—(CS)—H), amino (—NH$_2$), mono- and di-($C_1$-$C_{24}$ alkyl)-substituted amino, mono- and di-($C_5$-$C_{20}$ aryl)-substituted amino, $C_2$-$C_{24}$ alkylamido (—NH—(CO)-alkyl), $C_5$-$C_{20}$ arylamido (—NH—(CO)-aryl), imino (—CR=NH where R=hydrogen, $C_1$-$C_{24}$ alkyl, $C_5$-$C_{20}$ aryl, $C_6$-$C_{20}$ alkaryl, $C_6$-$C_{20}$ aralkyl, etc.), alkylimino (—CR=N(alkyl), where R=hydrogen, alkyl, aryl, alkaryl, etc.), arylimino (—CR=N(aryl), where R=hydrogen, alkyl, aryl, alkaryl, etc.), nitro (—NO$_2$), nitroso (—NO), sulfo (—SO$_2$—OH), sulfonato (—SO$_2$—O$^-$), $C_1$-$C_{24}$ alkylsulfanyl (—S-alkyl; also termed "alkylthio"), arylsulfanyl (—S-aryl; also termed "arylthio"), $C_1$-$C_{24}$ alkylsulfinyl (—(SO)-alkyl), $C_5$-$C_{20}$ arylsulfinyl (—(SO)-aryl), $C_1$-$C_{24}$ alkylsulfonyl (—SO$_2$-alkyl), $C_5$-$C_{20}$ arylsulfonyl (—SO$_2$-aryl), phosphono (—P(O)(OH)$_2$), phosphonato (—P(O)(O$^-$)$_2$), phosphinato (—P(O)(O$^-$)), phospho (—PO$_2$), and phosphino (—PH$_2$), mono- and di-($C_1$-$C_{24}$ alkyl)-substituted phosphino, mono- and di-($C_5$-$C_{20}$ aryl)-substituted phosphino; and the hydrocarbyl moieties $C_1$-$C_{24}$ alkyl (including $C_1$-$C_{18}$ alkyl, further including $C_1$-$C_{12}$ alkyl, and further including $C_1$-$C_6$ alkyl), $C_2$-$C_{24}$ alkenyl (including $C_2$-$C_{18}$ alkenyl, further including $C_2$-$C_{12}$ alkenyl, and further including $C_2$-$C_6$ alkenyl), $C_2$-$C_{24}$ alkynyl (including $C_2$-$C_{18}$ alkynyl, further including $C_2$-$C_{12}$ alkynyl, and further including $C_2$-$C_6$ alkynyl), $C_5$-$C_{30}$ aryl (including $C_5$-$C_{20}$ aryl, and further including $C_5$-$C_{12}$ aryl), and $C_6$-$C_{30}$ aralkyl (including $C_6$-$C_{20}$ aralkyl, and further including $C_6$-$C_{12}$ aralkyl). In addition, the aforementioned functional groups may, if a particular group permits, be further substituted with one or more additional functional groups or with one or more hydrocarbyl moieties such as those specifically enumerated above. Analogously, the above-mentioned hydrocarbyl moieties may be further substituted with one or more functional groups or additional hydrocarbyl moieties such as those specifically enumerated.

When the term "substituted" appears prior to a list of possible substituted groups, it is intended that the term apply to every member of that group. For example, the phrase "substituted alkyl and aryl" is to be interpreted as "substituted alkyl and substituted aryl."

Unless otherwise specified, reference to an atom is meant to include isotopes of that atom. For example, reference to H is meant to include $^1$H, $^2$H (i.e., D) and $^3$H (i.e., T), and reference to C is meant to include $^{12}$C and all isotopes of carbon (such as $^{13}$C).

Throughout the disclosure, the terms "sides" and "edges" are used. These terms are meant to have their ordinary meaning. For example, in some embodiments, "sides" are substantially flat surfaces, and "edges" are highly curved (i.e., sharp) surfaces that are formed by the intersection of two sides. In some embodiments, "sides" may be gradually curved and/or textured.

As used herein, the term "via" refers to a gap through an optical (i.e., dielectric) material. For example, for an optical layer overlaying a conductive layer, a via refers to a hole in the optical layer that allows for an electrical connection to the conductive layer.

As used herein, the term "wire" refers to a three-dimensional structure having one dimension that measures significantly greater than the other two. The term "wire" is not limited to any particular cross-sectional shape, and suitable cross-sectional shapes include circles, ovals, squares, rectangles, trapezoids, etc.

As used herein, the term "transparent" refers to a material that is permeable to electromagnetic radiation. In the specific context of a transparent material employed in an LED, the term refers to a material that is permeable to the wavelengths of electromagnetic radiation that are emitted by the LED. Unless stated otherwise, the term includes materials that are completely permeable as well as materials that are semi-permeable.

The devices of the invention are, generally, electronic devices that comprise a plurality of layers. Such layers may be homogeneous or non-homogeneous. By a "homogeneous layer" is meant that, at any point in the cross-section of a device, the presence and thickness of the layer is substantially the same. A "non-homogeneous layer" is a layer that varies in thickness or is not continuous (i.e., gaps exist in the layer). For example, a grid layer is a non-homogeneous layer because a cross section of a device having a grid layer will show areas where the layer is present and areas where the layer is absent. Patterned layers are non-homogeneous layers.

In some embodiments, then, there is provided an electroluminescent device (e.g., an OLED) having two electrode layers that are both formed from non-transparent materials. One of the electrodes, the "bottom" or "first" electrode (i.e., the electrode closest to the substrate) is in the form of a non-homogeneous layer. The other electrode, the "top" or "second" electrode (i.e., the electrode furthest from the substrate), is in the form of a substantially homogeneous layer.

Generally, the devices of the invention are electroluminescent devices that employ a transparent substrate, two electrode layers, and an electroluminescent layer between the electrode layers. Additional layers and features may be incorporated as described herein. One of the electrode layers functions as an electron injection layer, and the other electrode layer functions as a hole injection layer (also referred to as an electron hole injection layer). Photons are generated within the electroluminescent layer by the recombination of electrons with electron holes. The photons are emitted by the device into the environment through the transparent substrate.

In order to reach the substrate, photons generated in the electroluminescent layer must pass through the bottom electrode. To allow such passage, the devices of the invention employ a patterned bottom electrode. In some embodiments, the bottom electrode is in the form of a grid, for example a grid of intersecting wires. Further description of the bottom electrode is provided herein below.

The devices of the invention comprise a transparent substrate. Any suitable transparent material may be used for the substrate, and examples of such materials are provided below. For the purposes of this disclosure, the substrate is considered and referred to as the "bottom" layer of the devices of the invention. Thus, a first layer is "above" a second layer if the first layer is further from the substrate than the second layer— i.e., the second layer is between the substrate and the first layer. Similarly, a first layer is "below" a second layer if the first layer is between the substrate and the second layer. This convention of nomenclature is not intended to necessarily imply any particular order of deposition of the layers. Thus, although the substrate is referred to as the "bottom" layer, and all other layers are "above" the substrate, such references are not meant to imply that the substrate must necessarily be provided first, and that all layers are deposited onto the substrate. Embodiments wherein the layers of a device are deposited one after another, beginning with the substrate, are within the scope of the invention. But embodiments wherein the layers of the device are deposited one after another, ending with the substrate, are also within the scope of the invention.

Throughout this disclosure, references are made to "top" and "bottom" surfaces. It will be appreciated that the "top" surface of a layer refers to the surface that is furthest away from the substrate, and the "bottom" surface of a layer refers to the surface that is closest to the substrate.

The devices of the invention comprise an optical layer contacting the substrate. The optical layer is comprised of a transparent dielectric material, and examples of suitable materials are provided below. The optical layer may be deposited in a single step, forming a single layer of material, or the optical layer may be deposited in a combination of steps, forming a plurality of layers of material. Typically, however, where the optical layer is deposited in a combination of steps, the material used in each step will be the same, or the indices of refraction of the materials used in each step will be the same. Thus, in preferred embodiments, there are no changes in index of refraction among the materials used to form the optical layer for any particular device. The optical layer may be made from the same material as the substrate, such that the optical layer and the substrate function (optically) as a single layer. The optical layer is deposited directly over the substrate, such that the optical layer contacts (i.e., overlays) the substrate.

Above (and contacting) the optical layer is a conducting layer (as described previously, by "above" is meant that the conducting layer is further from the substrate than the optical layer). The conducting layer is transparent, and may be made from any suitable transparent conducting material. Some such materials are described below. In preferred embodiments, the conducting layer is conformally deposited over the optical layer.

Above (and contacting) the conducting layer is an electroluminescent layer. The electroluminescent layer may be made from any suitable electroluminescent material, and some such materials are described below. In preferred embodiments, the electroluminescent layer is conformally deposited over the conducting layer.

Above (and contacting) the electroluminescent layer is an electrode layer. The electrode layer above the electroluminescent layer is referred to herein as the "second" electrode layer or the "top" electrode. The second electrode layer is, in preferred embodiments, a homogeneous layer that is conformally deposited over the electroluminescent layer. In some embodiments, the second electrode functions as a cathode and/or electron injection electrode. In other embodiments, the second electrode functions as an anode and/or hole injection electrode. Examples of materials suitable for the second electrode are described below. Generally, although not necessarily, the second electrode is prepared from a non-transparent material.

It will be appreciated that the devices of the invention may further comprise additional layers overlaying the second electrode layer. For example, an encapsulation layer or a layer that provides desirable optical properties may be above the second electrode layer.

The devices of the invention further comprise a first electrode, which may alternatively be referred to herein as the "bottom" electrode. In some embodiments, the first electrode functions as a cathode and/or electron injection electrode. In other embodiments, the first electrode functions as an anode and/or hole injection electrode. Examples of materials suitable for the first electrode are described below. Generally, although not necessarily, the first electrode is prepared from a non-transparent material.

The bottom electrode is patterned in a pattern suitable to allow at least a portion of the photons generated in the electroluminescent layer to traverse the bottom electrode and exit the device through the substrate. Accordingly, the bottom electrode is a non-homogeneous layer. In preferred embodiments, the bottom electrode is patterned in a grid pattern. A grid pattern comprises a plurality of substantially parallel wires disposed in a first direction, and a plurality of substantially parallel wires disposed in a second direction. The first and second directions may be perpendicular (i.e., 90 degrees) to one another or may be at an angle other than 90 degrees (such as, for example 45 degrees) to one another.

In some embodiments, the bottom electrode is embedded within the optical layer, and does not contact the substrate. In other embodiments, the bottom electrode contacts both the substrate and the optical layer. In some such embodiments, the bottom electrode is disposed on the top side of the substrate. In other such embodiments, the bottom electrode traverses the interface between the substrate and the optical layer, such that the bottom electrode is partially embedded within the substrate and partially embedded within the optical layer. In still other such embodiments, the bottom electrode is embedded within the substrate such that the top surface of the bottom electrode is flush with the top surface of the substrate, and therefore the top surface of the bottom electrode contacts the optical layer.

The dimensions and cross-sectional shape of the wires of a grid bottom electrode according to the invention may be selected to optimize the properties of the device. For example, in preferred embodiments, the cross-sectional shape of the wires is trapezoidal or square, and therefore the wires comprise four surfaces (i.e., a top, a bottom, and two side surfaces) and four edges (i.e., two top edges and two bottom edges). In preferred embodiments, the top two edges of the wires contact the optical layer. For example, the two top edges may be completely embedded within the optical layer. Alternatively, the top surface of the wires may be flush with the top surface of the substrate, such that the two top edges of the wires are at the interface between the optical layer and the substrate.

In some embodiments, the wires of the grid bottom electrodes of the invention have an average cross-sectional width of between about 50 nm and about 2000 nm, or between about 100 nm and about 1500 nm, or between about 250 nm and about 1000 nm, or between about 500 nm and about 1000 nm, or between about 500 nm and 750 nm. In some embodiments, the wires have an average width that is less than 2000 nm, or less than 1500 nm, or less than 1250 nm, or less than 1000 nm, or less than 900 nm, or less than 800 nm, or less than 700 nm, or less than 600 nm, or less than 500 nm, or less than 400 nm, or less than 300 nm, or less than 200 nm, or less than 100 nm. In some embodiments, the wires have an average width that is greater than 50 nm, or greater than 100 nm, or greater than 200 nm, or greater than 300 nm, or greater than 400 nm, or greater than 500 nm, or greater than 600 nm, or greater than 700 nm, or greater than 800 nm, or greater than 900 nm, or greater than 1000 nm, or greater than 1250 nm, or greater than 1500 nm, or greater than 2000 nm.

Similarly, in some embodiments as described in more detail herein, the average width of the vias for any given device is less than the average width of the first electrode wires. For example, the vias may have an average width that is between 100 nm and 1500 nm, or between 250 nm and 1000 nm, or between 500 nm and 1000 nm, or between 500 nm and 750 nm. In some embodiments, the vias have an average width that is less than less than 1500 nm, or less than 1250 nm, or less than 1000 nm, or less than 900 nm, or less than 800 nm, or less than 700 nm, or less than 600 nm, or less than 500 nm, or less than 400 nm, or less than 250 nm, or less than 100 nm. In some embodiments, the vias have an average width that is greater than 100 nm, or greater than 250 nm, or greater than 400 nm, or greater than 500 nm, or greater than 600 nm, or greater than 700 nm, or greater than 800 nm, or greater than 900 nm, or greater than 1000 nm, or greater than 1250 nm, or greater than 1500 nm.

Grid electrodes comprise a first set of parallel wires running in a first direction and a second set of parallel wires running in a second direction. The preferred spacing between parallel sets of wires is influenced by the conductivity of the conductive material in the conductive layer. For materials having high conductivity (e.g., certain formulations of PEDOT or PEDOT derivatives), the spacing between parallel wires can be larger than for materials having low or medium conductivity (e.g., diluted PEDOT or PEDOT derivatives). Without wishing to be bound by theory, it is believed that this is because the higher conductivity material allows charges to spread through the conductive layer more efficiently before entering the electroluminescent layer, thereby allowing for more uniform emission from the electroluminescent layer. In general, then, the spacing between parallel wires (center-to-center) for the devices of the invention is between 1 µm and 500 µm, or between 2 µm and 400 µm, or between 2 µm and 300 µm, or between 5 µm and 300 µm, or between 5 µm and 200 µm, or between 10 µm and 200 µm, or between 10 µm and 100 µm, or between 15 µm and 100 µm, or between 20 µm and 50 µm. In some embodiments, the spacing between parallel wires (center-to-center) is between 1 µm and 5 µm, or between 1.5 µm and 5 µm, or between 1.5 µm and 4 µm, or between 2 µm and 4 µm, or between 2.5 µm and 4 µm. In some embodiments, the center-to-center spacing between parallel wires is less than 5 µm, or less than 4 µm, or less than 3 µm, or less than 3.5 µm, or less than 2 µm, or less than 2.5 µm. In some embodiments, the center-to-center spacing between parallel wires is greater than 1 µm, or greater than 2 µm, or greater than 2.5 µm, or greater than 3 µm, or greater than 3.5 µm, or greater than 4 µm, or greater than 5 µm. In some embodiments, the spacing between parallel wires running in the first direction is the same as the spacing between parallel wires running in the second direction. In other embodiments, the spacing between parallel wires running in the first direction is different from the spacing between parallel wires running in the second direction.

It will be appreciated that, for first electrodes comprising a grid of intersecting wires, the conductivity of the first electrode can be adjusted by varying the cross-sectional profile (i.e., width and height) of the wires. Similarly, the "transparency" of the first electrode (i.e., of the photons that are produced in the electroluminescent layer, the number of photons that are able to traverse the first electrode layer versus the overall number of photons that reach the first electrode layer) can be adjusted by varying the width and spacing of the wires.

In some embodiments, the first electrode is a grid electrode comprising a first set of parallel wires running in a first direction and a second set of parallel wires running in a second direction. In some such embodiments, the either the first set of wires carries current or the second set of wires carries current.

In preferred embodiments of the devices of the invention, a series of vias are present in the optical layer. The vias are channels within the optical layer, and are positioned to correspond to the position of the wires of the first electrode. Thus, where the first electrode comprises a grid of intersecting wires, the vias are present in a similarly arranged grid. The vias extend from the upper surface of the optical layer to the upper surface of the first electrode, thereby forming a channel that exposes the first electrode through the optical layer. As described previously, a conducting layer comprising a conducting material overlays the optical layer. The interior of the vias comprise a conducting material such that the vias form a conductive channel through the optical layer, electrically connecting the first electrode with the conductive layer.

As stated previously, the first electrode for devices according to the invention is a patterned electrode. For example, in preferred devices the first electrode is patterned in a grid of interconnected wires. Such electrodes comprise a first set of substantially parallel wires and a second set of substantially parallel wires. The first set of wires has a first average width and a first average depth, and the second set of wires has a second average width and a second average depth. The first average width may be the same or different from the second average width, and the first average depth may be the same or different from the second average depth. Typically, the first and second average widths will be the same, and the first and second average depths will be the same. All or a portion of the first set of wires intersect with all or a portion of the second set of wires, thereby forming a plurality of intersection points.

FIG. 1a schematically illustrates an intersection point between two wires. A first wire has a width of W1, and a second wire has a width of W2. The intersection between the two wires has a diameter (i.e., a maximum dimension) labeled D1. It will be appreciate that D1 may be greater than W1, greater than W2, or greater than both W1 and W2. It will also be appreciated that the intersection point may comprise curved rather than sharp corners, as shown by the dashed lines in FIG. 1a. Curved corners will further increase the value of D1.

When the first electrode is patterned in a grid as described above, the vias form a network of intersecting channels in the same grid pattern (thereby exposing the grid of electrodes to the conductive layer above the optical layer). Generally, the pattern of the vias mimics the pattern of the first electrode. In some embodiments, the vias do not expose the entire top surface of the first electrode. For example, where the first electrode comprises a network of wires having an average width W1, the vias will have an average width that is smaller than W1 such that a portion of the first electrode remains covered by the optical material of the optical layer. In preferred embodiments, the vias are centered over the wires of the first electrode such that the top two edges of the first electrode wires are covered by the optical material. See, for example, FIG. 3d (discussed below). Vias that are patterned as a grid will have the same dimensional considerations that are discussed above (as pertaining to FIG. 1a) for the first electrode. In other words, the vias will have a width, and points where vias intersect will have a diameter. In some embodiments, for any given device, the average width of the vias will be smaller than the average width of the wires of the first electrode. Furthermore, for any given device, the average diameter at the intersection of vias will be smaller than the average diameter at the intersection of wires. It will be appreciated, however, that for a given device the average diameter at the intersection of vias may be greater than the average width of the wires of the first electrode. Furthermore, in some embodiments (discussed below), the width of the vias is greater than the width of the wires of the first electrode.

Where the first electrode is formed using a masking technique, the same mask may be used to form the network of vias, or a different mask may be used to form the network of vias. Typically, the mask to form the vias will mimic the mask to form the first electrode (but may, for example, be modified to form vias that have smaller widths or diameters compared with the first electrode). By "mimic" is meant that certain features of the mask pattern will be similar, while other features of the mask pattern may be different. For example, a mask used to create the first electrode may form wires having width W1 and spacing S1. A "mimic" mask used to create the overlaying vias will create vias having a width W2 (where W1>W2) and spacing S2 (where S1=S2). Such masks will create a pattern of vias that exposes a portion of the top surface of the wires of the first electrode.

Without wishing to be bound by theory, the grid electrode distributes electrical current uniformly and efficiently through the vias into the conductive layer; the electrical current that passes each via is spread laterally throughout the conductive layer, which lights the device uniformly. Given this mechanism, the allowable distance between adjacent vias will depend on the conductivity of the organic conductive layer. That is, if the organic conductive layer has higher conductivity, the distance between vias can be made greater.

The transparency of the metal grid electrode can be estimated by calculating the portion of surface area that is not covered by the grid, versus the total surface area. If the width of the wires is D and the edge-to-edge spacing of the neighboring wires is S, transparency (T %) can be estimated using the following equation:

$$T\% = S^2/(S+D)^2 \qquad (1)$$

For example, if 0.5 μm wide wires are spaced 4 μm apart, the transparency estimated for the electrode using Equation (1) would be $4^2/(4+0.5)^2=79\%$. If the wires are narrowed to 0.25 μm, the transparency would increase to 89%. Alternatively, a larger S can be used to increase T % without reducing the width of the wires as long as the conductive layer has sufficient conductivity.

Because the conductivity of most metals is 1-2 orders of magnitude higher than that of ITO and because the cross-sectional thickness of the grid electrode can be adjusted, the sheet resistance of the grid electrode can be made equal to or less than that of an ITO electrode, which is typically in the order of 10Ω/□, without sacrificing transparency. For example, if the grid electrode is made from a 100 nm thick tungsten (W) film (i.e., the first electrode comprises wires having a thickness of 100 nm), the sheet resistance of the W thin film (Rs-w) equals the resistivity of W ($\rho_w$) divided by the film thickness (d). This is given by:

$$Rs\text{-}w = \rho_w/d = 5.60 \times 10^{-8} \ \Omega m / 100 \times 10^{-9} \ m = 0.56 \ \Omega/\square$$

Figure 1B:
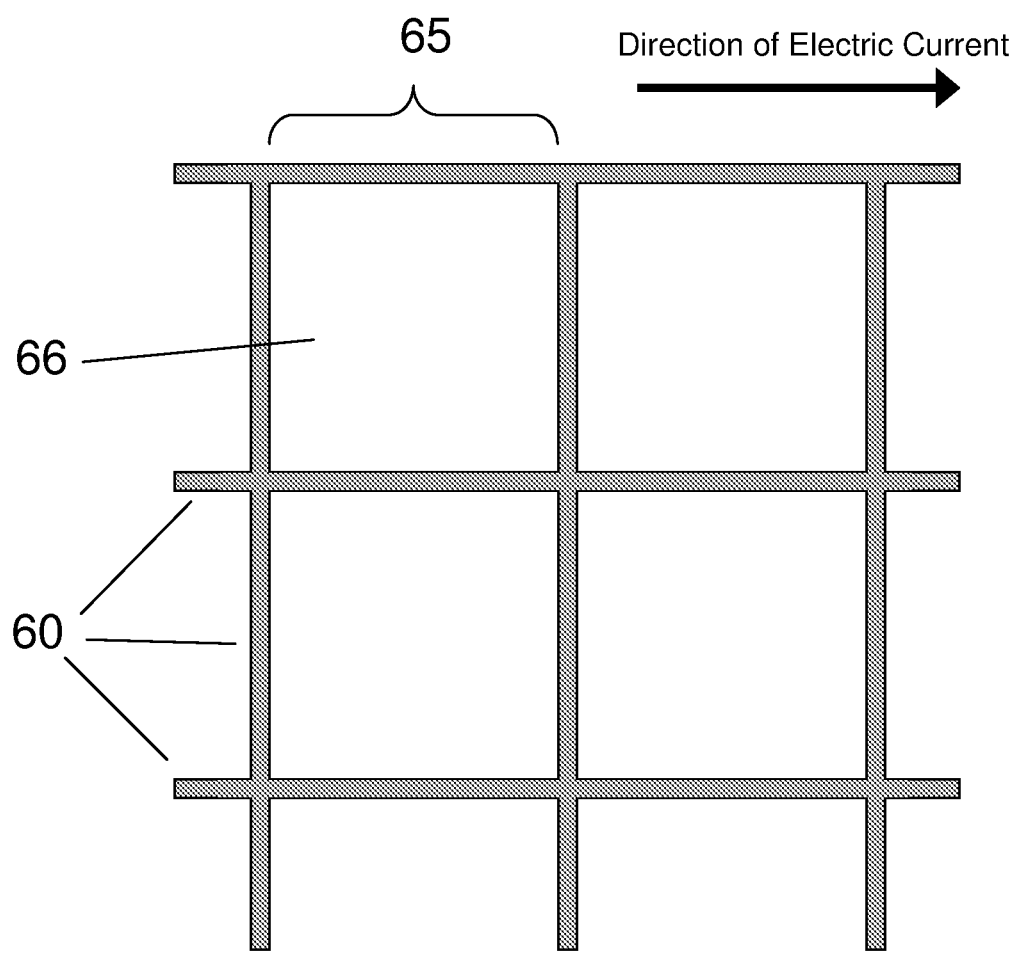
FIG. 1b provides a schematic representation of a grid first electrode according to an embodiment of the disclosure.

As an approximation, and with reference to FIG. 1, the equivalent sheet resistance of the grid electrode can be estimated using the resistance of a single wire in each square box, given that every square surface area of the grid electrode has only one metal line conducting electrical current. In FIG. 1, electrode wires 60 form a grid, and the direction of electrical current flow is shown by the heavy arrow. The section of wire labeled 65 can be considered the conductor for square 66. Using the previous example that assumed 0.5 μm wide wires spaced 4 μm apart, the length of the wire in each 4.5 μm×4.5 μm box is 9 squares (4.5/0.5=9□). Thus the resistance of each line (Rs-grid) is 0.56 Ω/□×9□=5.0Ω. The apparent sheet resistance of the grid electrode is Rs-grid=5.0Ω/□. If the width of the wires is reduced to 0.25 μm, the sheet resistance increases to 2×5.0Ω/□=10Ω/□, equivalent to that of the ITO electrode. If lower sheet resistance is desired, d can be increased accordingly.

As shown by the above discussion, a grid electrode according to the invention can be prepared having comparable resistivity and transparency to that of an ITO electrode. However, the optical performance of the grid electrode is significantly better than that of an ITO electrode because the grid electrode does not cause optical losses as an ITO electrode does. The devices of the invention reduce or eliminate the amount of light that is traditionally lost by reflection at the electrode/substrate interface when a transparent conductive electrode such as ITO is use. Particularly, if the optical layer material used in the devices of the invention has a refractive index close to or matching that of the substrate material, reflection is reduced or eliminated at the optical layer/substrate interface.

The second electrode may be patterned (i.e., non-homogeneous) or un-patterned (i.e., homogeneous). For example, the second electrode may be patterned as desired using a shadow mask or other means for creating a patterned layer. Similarly, the electroluminescent layer may be patterned or un-patterned.

Materials

The devices of the invention comprise a transparent substrate. Materials that are suitable for substrates in the methods of the invention are transparent or semi-transparent and are compatible with the OLED devices. Polymers and amorphous or semi-crystalline ceramics are preferred materials. Examples of inorganic materials include silicon dioxide (i.e., silica glass), various silicon-based glasses such as soda-lime glass and borosilicate glass, aluminum oxide, zirconium oxide, sodium chloride, diamond, and/or the like. Examples of transparent or semi-transparent polymeric materials include polyethylenenaphthalate, polycarbonate, polyethylene, polypropylene, polyester, polyimide, polyamides, polyacrylates, polymethacryates, and copolymers and mixtures thereof. The substrate may be rigid or flexible and may be of any suitable shape and configuration.

The devices of the invention further comprise an optical layer. Materials that are suitable for optical layers in the methods of the invention are transparent dielectric (i.e., non-conducting) materials. Polymers and amorphous or semi-crystalline ceramics are preferred materials. Examples of inorganic materials include silicon dioxide (i.e., silica glass), various silicon-based glasses such as soda-lime glass and borosilicate glass, aluminum oxide, zirconium oxide, sodium chloride, diamond, and/or the like. Examples of transparent or semi-transparent polymeric materials include polyethylenenaphthalate, polycarbonate, polyethylene, polypropylene, polyester, polyimide, polyamides, polyacrylates, polymethacryates, and copolymers and mixtures thereof.

In some embodiments, the optical material comprises a ceramic or a preceramic material. Such a material is a non-conductive material that is crosslinked (in the case of ceramic materials) or capable of forming a crosslinked network (in the case of preceramic materials).

In some embodiments, the optical material is a silicon-containing material that may be organic or completely inorganic. As an example, the optical material may have the structure of the preceramic materials described in U.S. Pat. No. 5,246,738 to Blum, issued Sep. 21, 1993 ("Hydridosiloxanes as Precursors to Ceramic Products"), and in co-pending U.S. patent application Ser. No. 12/330,319, filed Dec. 8, 2008, and may be synthesized by the methods disclosed therein. The disclosure of these documents pertaining to such materials and methods is hereby incorporated by reference.

For example, the optical material may comprise repeat units having the structure of formula (I):

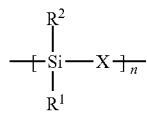
(I)

wherein $R^1$ and $R^2$ are independently selected from H, OH, $C_1$-$C_{30}$ hydrocarbyl, organometallic, halocarbyl, and organosilyl, each of which may be optionally substituted and optionally heteroatom containing, and wherein X is selected from —O—, and —$NR^3$—, wherein $R^3$ is hydrocarbyl. For example, each $R^1$ and $R^2$ may be H, OH, or hydrocarbyl. In preferred embodiments, $R^1$ and $R^2$ are selected from H, OH, $C_1$-$C_{20}$ alkyl, $C_2$-$C_{20}$ alkenyl, $C_2$-$C_{20}$ alkynyl, $C_1$-$C_{20}$ alkoxy, $C_5$-$C_{20}$ aryl, $C_5$-$C_{20}$ aryloxy, $C_6$-$C_{20}$ aralkyl, and $C_6$-$C_{20}$ alkaryl. In further preferred embodiments, $R^1$ and $R^2$ are selected from substituted or unsubstituted $C_1$-$C_{20}$ alkyl, substitute or unsubstituted heteroatom-containing $C_1$-$C_{20}$ alkyl, substituted or unsubstituted $C_2$-$C_{20}$ alkenyl, substitute or unsubstituted heteroatom-containing $C_2$-$C_{20}$ alkenyl, substituted or unsubstituted $C_2$-$C_{20}$ alkynyl, substitute or unsubstituted heteroatom-containing $C_2$-$C_{20}$ alkynyl, substituted or unsubstituted $C_5$-$C_{20}$ aryl, substitute or unsubstituted $C_5$-$C_{20}$ heteroaryl, substituted or unsubstituted $C_5$-$C_{20}$ aralkyl, substitute or unsubstituted heteroatom-containing $C_5$-$C_{20}$ aralkyl, substituted or unsubstituted $C_6$-$C_{20}$ alkaryl, and substitute or unsubstituted heteroatom-containing $C_5$-$C_{20}$ alkaryl. In some embodiments, $R^2$ is OH and $R^1$ is selected from alkyl, alkenyl, alkynyl, alkoxy, aryl, aryloxy, aralkyl, and alkaryl, any of which may be heteroatom containing, and any of which may be unsubstituted or substituted with one or more groups selected from halo, hydroxyl, alkyl, and aryl. In some embodiments, $R^1$ is lower alkyl, such as methyl or ethyl, and $R^2$ is H, OH, or $C_1$-$C_{20}$ alkoxy. In some preferred embodiments, X is —O—, such that the material is a siloxane or polysiloxane material.

Furthermore in formula (I), n is an integer that is greater than or equal to 1. Accordingly, monomers, dimers, trimers, and higher-order materials such as oligomers and polymers are suitable. It will be appreciated that the optical material may comprise a mixture of different compounds, each comprising repeat units having the structure of formula (I) but having various values of n.

For example, the optical material may comprise repeat units having the formula [$R^1$Si(OH)O], [$R^1$Si($OR^{2a}$)O], and/or [$R^1$Si(H)O], wherein $R^1$ is as defined above and $R^{2a}$ is selected from hydrocarbyl and organosilyl.

The optical material is either crosslinked or cross-linkable via a curing reaction. Curing can be carried out using any method that is effective in crosslinking the material and that is compatible with any of the other OLED elements present. For example, application of heat and/or UV radiation for a predetermined period of time is an effective method of curing the preceramic materials that crosslink at elevated temperature and/or exposure to radiation. Alternatively or in addition, a crosslinking catalyst such as an organic amine or another organic base may be used to crosslink the bonding material. It will be appreciated that, in some cases, there is no need to induce the curing reaction (e.g., by applying heat), as such reaction will occur spontaneously. In preferred embodiments, any byproducts that result from the curing reaction are small molecules (e.g., water, methanol, and the like) that are conveniently removed by solvent washes or by the application of vacuum.

In some embodiments, after curing, the ceramic material comprises crosslinked units having the structure —[Si($R^2$)(X)$_{1.5}$]—, wherein: $R^2$ is selected from H, hydroxyl, fluorocarbyl, and hydrocarbyl; X is selected from —O— and —$NR^3$—; and $R^3$ is selected from alkyl and aryl. For example, X is —O— and $R^2$ is selected from alkyl, alkenyl, alkynyl, alkoxy, aryl, aryloxy, aralkyl, and alkaryl, any of which may be heteroatom containing, and any of which may be unsubstituted or substituted with one or more groups selected from halo, hydroxyl, alkyl, and aryl.

The ceramic materials described above may be prepared, for example, using a dehydrocoupling reaction and/or hydrosilylation reaction as described in U.S. application Ser. No. 12/330,319. For example, the ceramic material may be prepared by the reaction of polyhydridomethylsiloxane (PHMS) with water and/or an alcohol in the presence of a transition metal catalyst such as $Ru_3(CO)_{12}$, $H_2PtCl_6$, or the like. The ceramic material, once prepared, can be purified of the transition metal catalyst using, for example, silica gel or charcoal column as is typical in the art.

The devices of the invention further comprise a conductive layer. Materials that are suitable for conductive layers in the methods of the invention are conductive, transparent, and suitable for deposition over the optical layer and into the vias. The conductive material may be organic or inorganic (including metals and metal oxides). In preferred embodiments, the conductive material is organic.

A preferred material for the conductive material is a transparent conductive polymer such as poly(3,4-ethylenedioxythiophene) (PEDOT). Derivatives and copolymers of PEDOT, such as PEDOT/polystyrenesulfonate, are further examples of suitable materials. Additional materials that are suitable include polyaniline (PANI), graphene, carbon nanotubes, and graphene-carbon nanotube hybrids. Non-polymeric organic materials that are conductive and transparent may also be used.

The conductive material may alternatively be a transparent inorganic material such as a transparent conducting oxide (TCO). Examples include conductive or semiconductive metals and/or metal oxide layers such as: tin oxide; zinc oxide; Ag; $SnO_2$:X, where X=Sb, Cl, or F; $In_2O_3$:X where X=Sb, Sn, Zn (i.e., indium tin oxide, indium zinc oxide, etc.); $CdSnO_4$; TiN; ZnO:X, where X=In, Al, B, Ga, F; $Zn_2SnO_4$; $ZnSnO_3$; and $Cd_2SnO_4$. Furthermore, the conductive material may be an ultra thin metal (e.g., Ag, Au, Cr, Al, Ti, Co, Ni, etc.). The conductive material may be any combinations of the metals, metal oxides, and organic conductive materials described herein.

The devices of the invention further comprise an electroluminescent layer. Materials that are suitable for electroluminescent layers in the methods of the invention are materials capable of receiving a hole from the hole-injection layer and an electron from the electron-injection layer and emitting electromagnetic radiation (e.g., light) when the injected holes and electrons combine. Accordingly, in certain embodiments, the electroluminescent material may include any of a number of organic or inorganic compounds or mixtures thereof, such as multi-layers of organics or small molecules or the like. For instance, the electroluminescent layer may include a polymeric material or be composed of one or more small molecule materials. However, the material must contain at least one electroluminescent compound, for instance, an organic, inorganic or small molecule electroluminescent compound. In certain embodiments, the electroluminescent compound may include a simple organic molecule or complex polymer or copolymer. For example, a simple organic luminescent molecule may include tris(8-hydroxyquinolinato)-aluminum or perylene.

In certain embodiments, the electroluminescent material includes a polymer or copolymer. The molecular structure of a suitable polymer or copolymer may include a carbon-based or silicon-based backbone. The polymers and copolymers may be linear, branched, crosslinked or any combinations thereof, and may have a wide range of molecular weights from as low as about 5000 to more than 1,000,000. In the case of copolymers, the copolymers may be alternating, block, random, graft copolymers, or combinations thereof. Examples of suitable electroluminescent polymers useful in conjunction with the present invention include, but are not limited to, conjugated polymers such as, polyparaphenylenes, polythiophenes, polyphenylenevinylenes, polythienylvinylenes, polyfluorenes, 1,3,4-oxadiazole-containing polymers, and various derivatives and copolymers thereof.

An exemplary electroluminescent polymer is an arylamine-substituted poly(arylene-vinylene) polymer that has the general structure of formula (II) below:

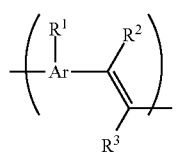

(II)

wherein: Ar is arylene, heteroarylene, substituted arylene or substituted heteroarylene containing one to three aromatic rings;

$R^1$ is the arylamine substituent and is of the formula —$Ar^1$—$N(R^4R^5)$ wherein $Ar^1$ is as defined for Ar and $R^4$ and $R^5$ are independently hydrocarbyl, substituted hydrocarbyl, heteroatom-containing hydrocarbyl, or substituted heteroatom-containing hydrocarbyl; and $R^2$ and $R^3$ are independently selected from the group consisting of hydrido, halo, cyano, hydrocarbyl, substituted hydrocarbyl, heteroatom-containing hydrocarbyl, and substituted heteroatom-containing hydrocarbyl, or $R^2$ and $R^3$ may together form a triple bond.

Other moieties may be as follows:

Ar may be a five-membered or six-membered arylene, heteroarylene, substituted arylene or substituted heteroarylene group, or may contain one to three such groups, either fused or linked. Preferably, Ar is comprised of one or two aromatic rings, and is most preferably comprised of a single aromatic ring that is five-membered or six-membered arylene, heteroarylene, substituted arylene or substituted heteroarylene. $Ar^1$, the arylene linking moiety in the arylamine substituent, is defined in the same way.

The substituents $R^2$ and $R^3$ are generally hydrido but may also be halo (particularly chloro or fluoro) or cyano, or substituted or unsubstituted alkyl, alkoxy, alkenyl, alkynyl, aryl and heteroaryl.

$R^4$ and $R^5$ may the same or different and, as noted, are hydrocarbyl, substituted hydrocarbyl, heteroatom-containing hydrocarbyl, or substituted heteroatom-containing hydrocarbyl. For example, $R^4$ and $R^5$ may be alkyl, alkoxy-substituted alkyl, polyether-substituted alkyl, nitro-substituted alkyl, halo-substituted alkyl, aryl, alkoxy-substituted aryl, polyether-substituted aryl, nitro-substituted aryl, halo-substituted aryl, heteroaryl, alkoxy-substituted heteroaryl, polyether-substituted heteroaryl, nitro-substituted heteroaryl, halo-substituted heteroaryl, and the like. In certain embodiments the substituents are aryl, e.g., phenyl, alkoxy-substituted phenyl (particularly lower alkoxy-substituted phenyl such as methoxyphenyl), polyether-substituted phenyl (particularly phenyl substituted with a —$CH_2$ ($OCH_2$ $CH_2)_n$ $OCH_3$ or —($OCH_2$ $CH_2)_2$ $OCH_3$ group where n is generally 1 to 12, preferably 1 to 6, most preferably 1 to 3), and halo-substituted phenyl (particularly fluorinated or chlorinated phenyl).

Another exemplary electroluminescent polymer material that is described in U.S. Pat. No. 6,414,104, is an arylamine-substituted poly(arylene-vinylene) polymer that contains monomer units having the general structure of formula (III) as follows:

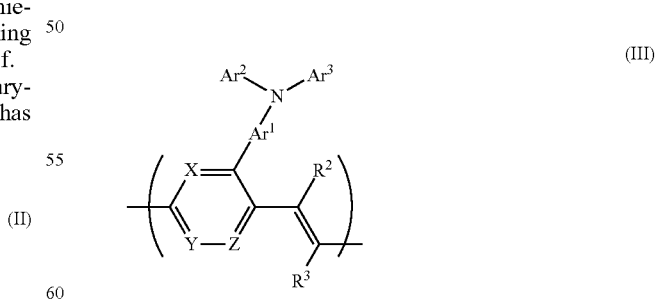

(III)

Wherein: X, Y and Z are independently selected from the group consisting of N, CH and $CR^6$ wherein $R^6$ is halo, cyano, alkyl, substituted alkyl, heteroatom-containing alkyl, aryl, heteroaryl, substituted aryl, or substituted heteroaryl, or wherein two $R^6$ moieties on adjacent carbon atoms may be linked to form an additional cyclic group;

Ar¹ is as defined above;

Ar² and Ar³ are independently selected from the group consisting of aryl, heteroaryl, substituted aryl and substituted heteroaryl containing one or two aromatic rings; and R² and R³ are as defined above.

In formula (I) above, the polymer is a poly(phenylene vinylene) derivative when X, Y and Z are all CH. When at least one of X, Y and Z is N, the aromatic ring will be, for example, substituted or unsubstituted pyridinyl, pyridazinyl, pyrimidinyl, pyrazinyl, 1,2,4-triazinyl, or 1,2,3-triazinyl. For instance, one of X, Y and Z may be CH and the other two may be either CH or CR⁶, wherein R⁶ may be a heteroatom-containing alkyl, for instance, alkoxy, or a polyether substituent —CH$_2$(OCH$_2$CH$_2$)$_n$OCH$_3$ or —(OCH$_2$CH$_2$)$_n$OCH$_3$ group where n is may be 1 to 12, for instance, 1 to 6, such as 1 to 3.

The polymer may be a homopolymer or a copolymer with at least one additional type of monomer unit. Preferably, if the polymer is a copolymer, the additional monomer units are also arylene-vinylene monomer units, for example having the structure of Formula (IV):

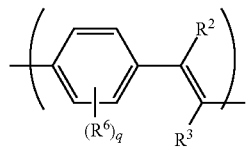

(IV)

wherein R², R³ and R⁶ are as defined previously and q is an integer in the range of zero to 4 inclusive.

Examples of specific polymers having the structure of formula (I) are poly(2-(4-diphenylamino-phenyl)-1,4-phenylene vinylene and poly(2-(3-diphenylaminophenyl)-1,4-phenylene vinylene.

Examples of specific polymers disclosed in U.S. Pat. No. 6,414,104 are poly(2-(4-diphenylamino-phenyl)-1,4-phenylene vinylene and poly(2-(3-diphenylaminophenyl)-1,4-phenylene vinylene.

Electroluminescent polymers appropriate for use in this invention are also described in U.S. Pat. Nos. 6,723,828, 6,800,722, and 7,098,297, both of which are incorporated by reference herein. In those referenced patents there is disclosed a conjugated polymer containing monomer units having the structure of formula (V):

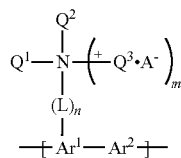

(V)

Wherein: Ar¹ and Ar² are independently selected from the group consisting of monocyclic, bicyclic and polycyclic arylene, heteroarylene, substituted arylene and substituted heteroarylene groups;

L is alkylene, alkenylene, substituted alkylene, substituted alkenylene, heteroalkylene, heteroalkenylene, substituted heteroalkylene, substituted heteroalkenylene, arylene, heteroarylene, substituted arylene or substituted heteroarylene;

m is zero or 1;

n is zero or 1;

Q¹ and Q² are independently selected from the group consisting of H, aryl, heteroaryl, substituted aryl, substituted heteroaryl, alkyl, and substituted alkyl, and Q³ is selected from the group consisting of alkyl and substituted alkyl, with the proviso that when m is 1, Q¹ and Q² are other than H; and A⁻ is a negatively charged counterion.

The electroluminescent material may also include blends of polymers within formula (IV) with other polymers, as well as a variety of copolymers.

The devices of the invention further comprise a top electrode layer (i.e., a second electrode) and a bottom electrode (i.e., a first electrode). Materials that are suitable for these electrode layers in the methods of the invention are metals such as Au, Pt, Ag, Al, Ti, Cr, Mn, Fe, Co, Ni, Cu, Zn, etc. Conducting metal oxides, such as oxides of SN, In, La, Ti, Cr, Mn, Fe, Co, Ni, Cu, or Zn may also be used. Any other suitable conducting material (such as conducting polymers, carbon nanotubes, graphene, hybrids thereof, etc.) may also be used. In some embodiments, the second electrode is made from a transparent material (such as ITO or the like). Such embodiments comprise devices that are able to emit photons from both sides of the device.

Deposition of the layers described herein can be accomplished by any appropriate method. For example, methods include chemical solution deposition methods, such as sol-gel processing, dip coating, spin coating, spray coating, and the like. Metal layers may be deposited using, for example, vacuum deposition methods (e.g., sputtering, thermal evaporation, chemical vapor deposition, etc.). Formation of the patterned first electrode may be accomplished by any appropriate patterning technique, such as lithographic methods and the like.

In some embodiments, the devices of the invention may be prepared as follows. A transparent substrate is provided. A patterned first electrode is deposited on the substrate. The first electrode may be recessed into the substrate (i.e., by etching an appropriate pattern into the substrate before depositing the first electrode), or may overlay the top face of the substrate. In some embodiments, the first electrode is entirely recessed into the substrate, meaning that the top surface of the first electrode and the top surface of the substrate are coplanar. The first electrode may be deposited by first depositing a homogeneous layer of electrode material and subsequently etching or otherwise removing material to form the patterned first electrode. Alternatively, the first electrode may be deposited directly as a patterned layer, such as by depositing the layer through a mask or by "painting" the patterned layer onto the substrate using the electrode material.

After deposition of the patterned first electrode, an optical material is deposited over the first electrode and substrate. A pattern of vias that mimics the pattern of the first electrode is created in the optical material (e.g., by etching or otherwise removing optical material). The vias are formed such that a portion of the top surface of the first electrode is exposed through the vias. A conductive material is deposited over the optical material and in the vias such that the conductive material contacts the top surface of the first electrode through the vias. An electroluminescent material is deposited over the conducting material, either as a homogeneous layer or as a patterned layer. A second electrode is deposited over the electroluminescent material; the second electrode is also created as a homogeneous layer or as a patterned layer.

In some embodiments, the first electrode does not contact the substrate. Such devices may be prepared according to the following procedure. A transparent substrate is provided. A first portion of optical material is deposited over the substrate. The first portion of optical material may be optionally patterned by etching or otherwise removing portions of the optical material. A patterned first electrode is formed on the first portion of optical material. If the first potion of optical material is patterned, the first electrode may be recessed within the pattern; if the first portion of optical material is unpatterned, the first electrode will overlay the optical material. A second portion of optical material is optionally deposited over the first portion and over the first electrode, thereby forming a smooth top surface and encapsulating the first electrode within optical material. If the second portion of optical material is deposited, then a pattern of vias is subsequently formed in the second portion of optical material by removing optical material such that a fraction of the top surface of the first electrode is exposed through the vias. A conductive material is deposited over the second portion of optical material and in the vias such that the conductive material contacts the top surface of the first electrode through the vias. In an alternative embodiment, if the second portion of optical material is not deposited, then the conductive material is deposited directly over the first electrode and over the first portion of optical material. An electroluminescent material is deposited over the conducting material (again forming either an unpatterned or a patterned layer). A second electrode is deposited (again as a patterned or unpatterned layer) over the electroluminescent material.

In some embodiments, the width of the vias is equal to or greater than the width of the electrode wires. Devices according to such embodiments may be prepared in a number of ways. As a first example, the width of the vias may be the same as the width of the wires, and both features may be formed by the same mask/lithography process. As a second example, identical widths of the vias and wires may be obtained in the following manner. Over a transparent substrate, an optical layer is deposited and subsequently patterned, e.g., with a series of grooves corresponding to the grid pattern desired for the bottom electrode. Bottom electrode wires are deposited into the grooves of the optical material. In one embodiment of this example, the wires only partially fill the grooves, and in other embodiments, the wires completely fill the grooves (but do not extend beyond the top of the grooves). In a third example, the devices are formed by etching a pattern into a substrate, depositing the bottom grid wires into the etched pattern, depositing optical material over the substrate and bottom electrode, and subsequently etching a pattern of vias into the optical material. The vias etched in this manner may have the same or larger width compared with the width of the wires. In any of the foregoing examples, the entire side faces of the wires contact the substrate, the optical material, or both substrate and optical material such that the top two edges of the wires are also contacting the substrate and/or optical material.

In any of the above embodiments, it will be appreciated that the electrodes can be deposited either as a single layer or as a combination of layers. For example, an electrode can be deposited as a pair of layers comprising anode and hole injection materials, or as a single layer. Similarly, an electrode can be deposited as a pair of layers comprising cathode and electron injection materials, or as a single layer. Furthermore, additional layers such as an encapsulation layer may be deposited over the second electrode.

Devices and Figures

The invention disclosed herein is suitable for preparing electroluminescent devices such as OLEDs. Additionally, other optoelectronic (e.g., photovoltaic and electrochromic) devices with energy management capabilities can benefit from the use of non-transparent electrodes as disclosed herein. The devices of the invention benefit from a variety of advantages over traditional devices. For example, because the first electrode is patterned, non-transparent materials may be used for the first electrode. In some embodiments, this results in lower cost and/or lower weight devices. Furthermore, the presence of the first electrode as a patterned layer helps to ensure emission of some photons that would otherwise be captured within the device (particularly some of those photons that would otherwise be reflected at the top surface of the substrate). This principle is illustrated in the Figures and discussed below.

Figure 2:
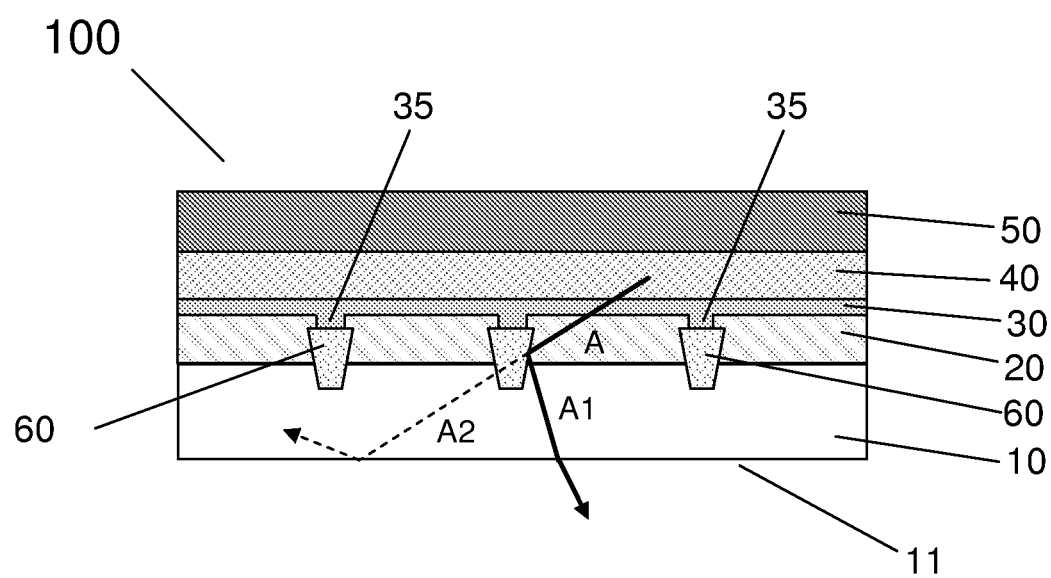
FIG. 2 provides a schematic representation of a device according to an embodiment of the disclosure.

With reference to FIG. 2, device 100 according to one embodiment of the invention is shown schematically and in cross-section. Substrate 10 is prepared using a transparent material. Optical (i.e., insulator) layer 20 is in contact with one side (the internal side) of substrate 10. The side of substrate 10 that is opposite from optical layer 20 forms interface 11 between the substrate and the environment. Conductive layer 30 overlays optical layer 20. Electroluminescent layer 40 overlays conductive layer 30. Second electrode layer 50 overlays electroluminescent layer 40. Embedded within device 100 and intersecting substrate 10 and optical layer 20 is first electrode 60. Three regions of first electrode 60 are shown in FIG. 2. It will be appreciated that first electrode 60 is, in fact, a continuous electrode (e.g., a grid or other embodiment according to the invention). Thus, although three discrete electrode regions appear in the cross-sectional view shown in FIG. 2, such electrode regions are interconnected in a different cross section (not shown). Device 100 further contains vias 35 (three are shown in FIG. 2) that form channels through optical layer 20. Vias 35 contain the same conductive material that forms conductive layer 30, and are thus electrically continuous with conductive layer 30 and may be considered part of conductive layer 30. In addition to forming one of the electrodes required for operation of device 100, first electrode 60 also provides a means for directing photons emitted by electroluminescent layer 40. For example, when a photon is emitted from electroluminescent layer 40 having a trajectory shown by path A, the photon reflects off of first electrode 60 and follows path A1. In the absence of first electrode 60, the photon would have followed the alternative trajectory shown by path A2. It can be seen that path A2 intersects interface 11 (i.e., the interface between substrate 10 and the environment) with an angle of incidence that is too great to allow the photon to escape device 100. In contrast, path A1 intersects interface 11 with a much smaller angle of incidence, and is transmitted through the interface and into the environment. Thus, first electrode 60 further functions to increase the amount of light that is emitted by device 100.

Figure 3:
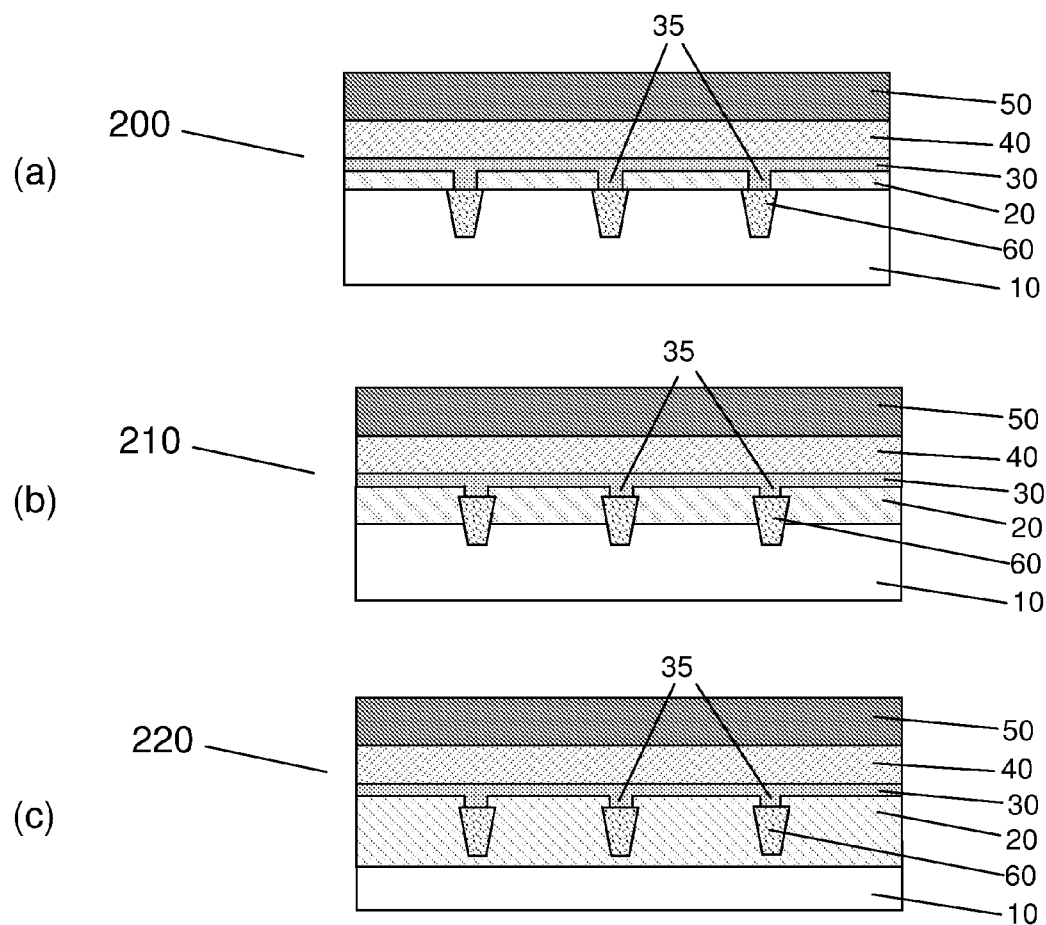
FIG. 3 provides schematic representations of several device architectures according to embodiments of the disclosure.

With reference to FIGS. 3(a), 3(b), and 3(c), devices 200, 210, and 220 are shown schematically and in cross-section. In each of the devices, substrate 10 comprises a transparent material. Optical layer 20 is in contact with one side (the internal side) of substrate 10. The external side of substrate 10 (i.e., the side that is opposite from optical layer 20) forms interface 11 between the substrate and the environment. Conductive layer 30 overlays optical layer 20. Electroluminescent layer 40 overlays conductive layer 30. Second electrode layer 50 overlays electroluminescent layer 40. Embedded within each of the devices is first electrode 60 (three regions of electrode 60 are shown in each device). In device 200, second electrode 60 is completely embedded within substrate 10, such that one side of second electrode 60 is flush with one side of substrate 10. In device 210, second electrode 60 traverses the interface between substrate 10 and optical layer 20. In device 220, second electrode 60 is completely embedded within optical layer 20, such that second electrode 60 does not contact substrate 10. Devices 200, 210, and 220 further contain vias 35 (three are shown in each of the devices) that form channels through optical layer 20. Vias 35 are filled with the same conductive material that forms conductive layer 30, and are thus electrically continuous with conductive layer 30 and may be considered part of conductive layer 30. In device 200, vias 35 extend through the entire optical layer 20, whereas in devices 210 and 220, vias 35 extend only partially through optical layer 20. In each device, vias 35 extend to first electrode 60 such that the conductive material inside the vias contacts first electrode 60.

Figure 3D:
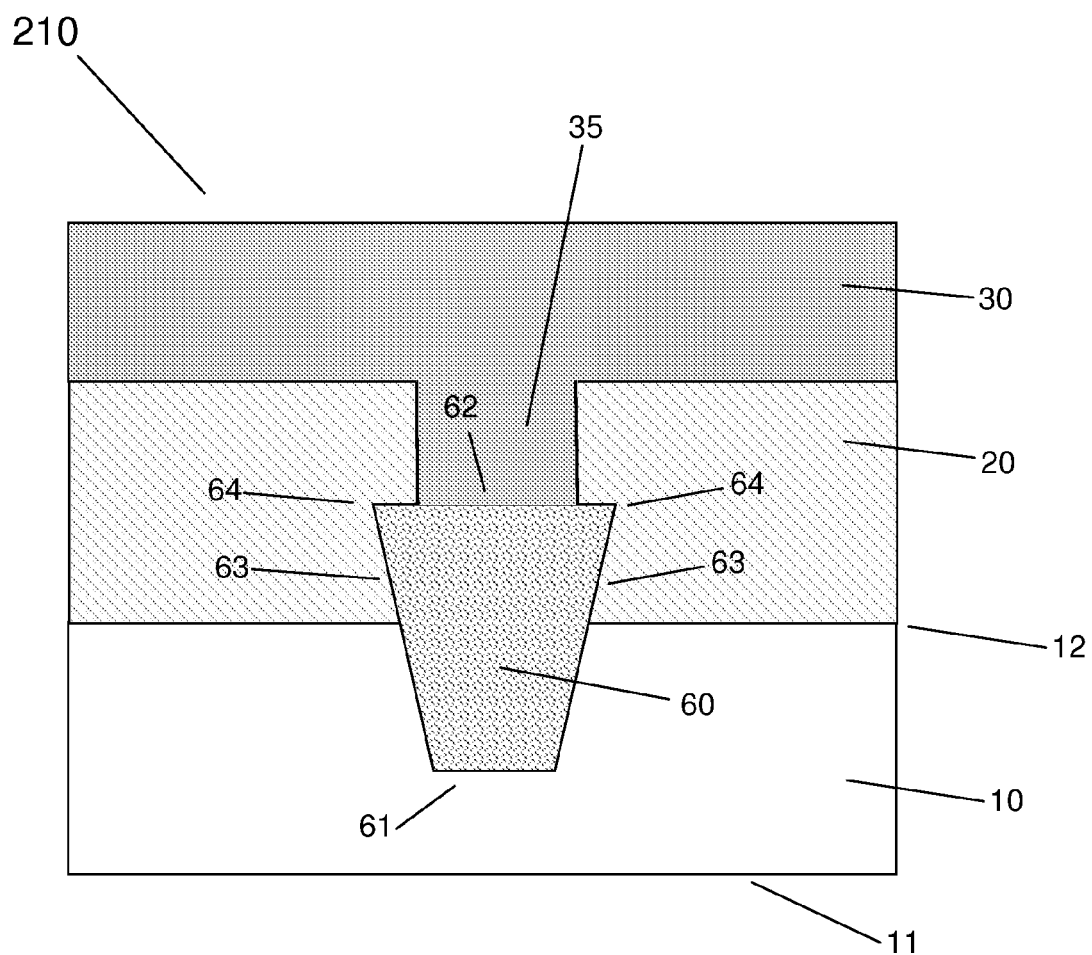

An enlarged view of device 210 is shown in FIG. 3(d). First electrode 60 comprises a wire that has a trapezoidal cross-section, with bottom 61, top 62, and sides 63. It will be appreciated that "bottom" refers to the face of the first electrode that is contacting the substrate, or, when the first electrode does not contact the substrate, then the "bottom" refers to the face that is nearest to the substrate. Similarly, "top" refers to the face of the first electrode that is opposite the bottom face. First electrode 60 further comprises edges 64 that are contacting (i.e., embedded within) optical layer 20. As described herein supra, by embedding edges 64 within an optical (i.e., non-conductive) material, the devices of the invention produce little or no conduction through the edges of the first electrode.

Figure 4:
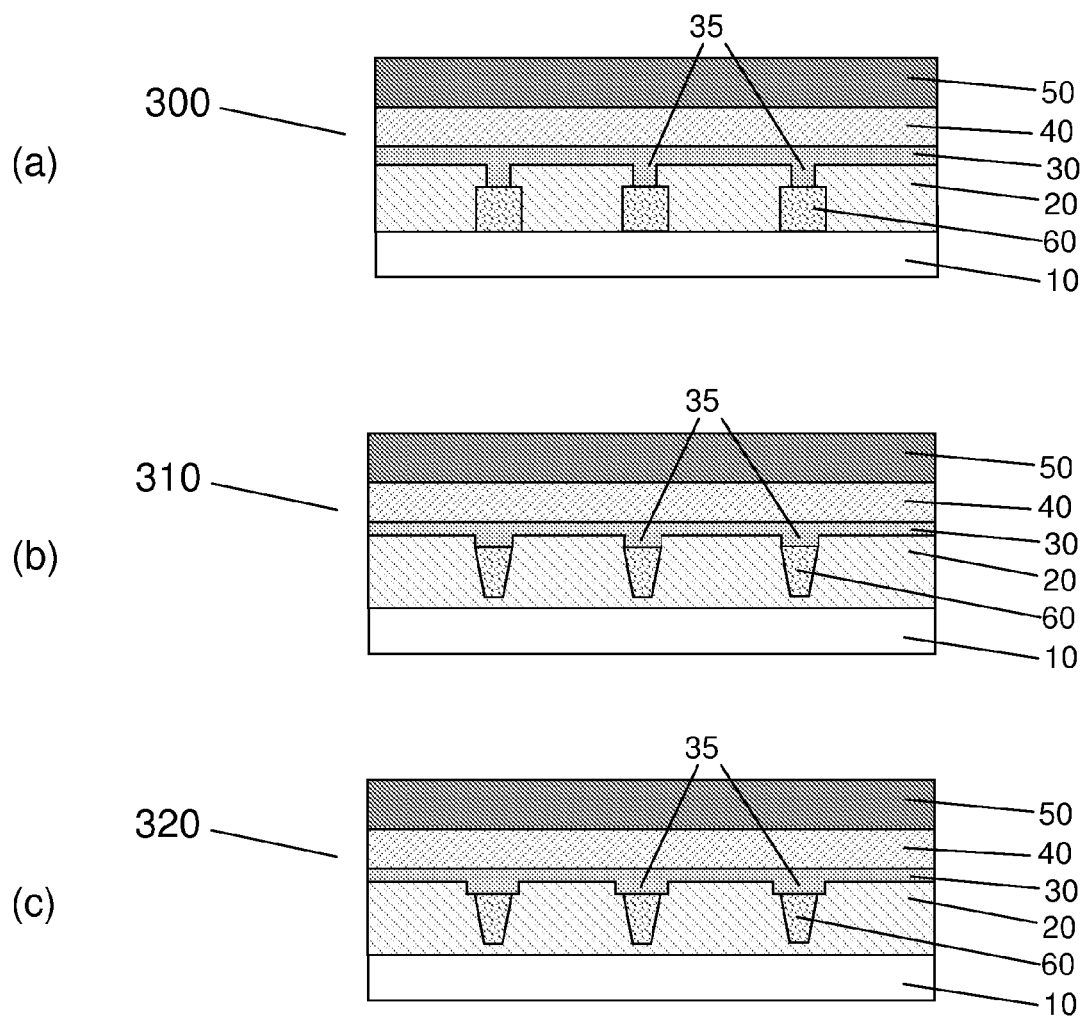
FIG. 4 provides a schematic representation of devices according to various embodiments of the disclosure.

Also shown in FIG. 3(d) is external surface 11, which is the interfacial surface between substrate 10 and the environment, and internal surface 12, which is the interfacial surface between substrate 10 and optical layer 20. It will be appreciated that the position of first electrode 60 within the device may be varied, as demonstrated by devices 200, 210, and 220. As a further example, bottom 61 may be contacting surface 12 (such as also demonstrated by device 300 in FIG. 4).

With reference to FIG. 4a, device 300 is shown schematically and in cross-section. As with the devices in FIG. 2 and FIG. 3, device 300 contains substrate 10, optical layer 20, conductive layer 30, electroluminescent layer 40, and second electrode 50. First electrode 60 has a square cross-section (again, three regions of first electrode 60 are shown in the device) and is disposed directly on top of substrate 10. In other words, the bottom face of first electrode 60 contacts the interface between substrate 10 and optical layer 20. Vias 35 extend through optical layer 20, allowing the conductive material within vias 35 to contact second electrode 60.

With reference to FIGS. 4b and 4c, devices are shown having vias 35 that are equal in width to the width of the first electrode 60 (device 310) or having vias 35 that are greater in width to the width of the first electrode 60 (device 320).

All patents, patent applications, and publications mentioned herein are hereby incorporated by reference in their entireties. However, where a patent, patent application, or publication containing express definitions is incorporated by reference, those express definitions should be understood to apply to the incorporated patent, patent application, or publication in which they are found, and not to the remainder of the text of this application, in particular the claims of this application.

It is to be understood that while the invention has been described in conjunction with the preferred specific embodiments thereof, that the foregoing description as well as the examples that follow, are intended to illustrate and not limit the scope of the invention. It will be understood by those skilled in the art that various changes may be made and equivalents may be substituted without departing from the scope of the invention, and further that other aspects, advantages and modifications will be apparent to those skilled in the art to which the invention pertains.

EXAMPLES

Example 1

Figure 5A:
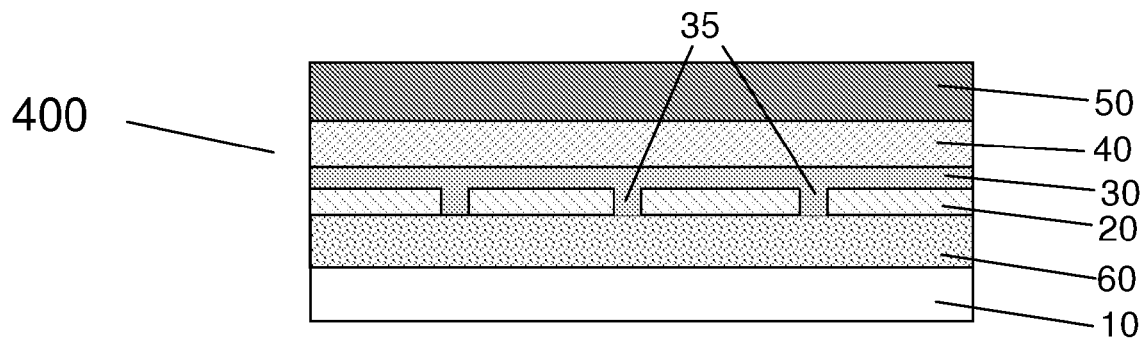
FIG. 5a provides a schematic representation of a device having vias in an optical layer and having a conductive material disposed in and over the vias.

A device, shown schematically and in cross-section as device 400 in FIG. 5a, was prepared according to the following procedure. Beginning with a commercial ITO/glass substrate, a plasma-enhanced chemical vapor deposition (PECVD) process was used to deposit a thin layer of $SiO_2$ on top of the ITO/glass substrate. The substrate was subsequently patterned with an array of vias with diameters ranging from 0.3-3.0 µm that were spaced 2-7 µm apart using a standard lithography process. Reactive ion etching (RIE) was used to generate the vias through the $SiO_2$ layer. After stripping the resist, the substrate was subjected to a standard OLED fabrication process, which included spin-coating a PEDOT layer, spin-coating the light-emitting polymer (LEP) layer, and evaporating a Ca/Al cathode. In FIG. 5a, glass substrate 10 has an overlaying ITO layer 60. Vias 35 extend through $SiO_2$ layer 20. The PEDOT layer 30 fills vias 35. LEP layer 40 overlays PEDOT layer 30, and Ca/Al cathode layer 50 overlays LEP layer 40.

Devices according to this procedure were prepared having different insulating layer thicknesses, different via diameters, and different spacing. All these parameters were found to influence device performance. At certain combinations of these parameters, the device EQE was 10-20% higher than a control device fabricated on a regular ITO electrode without the insulating ($SiO_2$) layer; at a more optimized combination of these parameters, the device EQE was by 100-200% higher than the control device. The devices also had similar lifetime and similar current density-voltage-brightness (JVB) characteristics, except that in most cases the control device had a slightly higher leakage current.

Figure 5B:
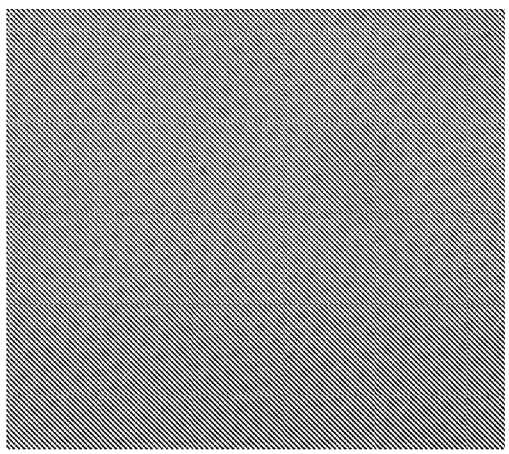
FIG. 5b provides an image of a device taken under an optical microscope at 6 V applied voltage with ~8000 cd/m² device brightness. The dark spots indicate via locations.

Optical microscopy of these devices revealed that the conductivity of the PEDOT layer was sufficient to allow the electric current to spread laterally around the vias and illuminate the entire LEP film fairly uniformly. FIG. 5b is an image of a device operating at 6 V applied voltage (device brightness≈8000 $cd/m^2$, EQE≈11%) taken under an optical microscope using a CCD camera. The image demonstrates that the device illuminated uniformly in areas away from the vias. Areas directly above the vias were significantly darker because the LEP film deposited by spin-coating was thicker over the vias and thinner in areas away from the vias. A cross-section transmission electron microscope (TEM) analysis confirmed that the LEP film inside the vias was approximately 10 nm thicker than that outside the vias (data not shown).

Figure 6:
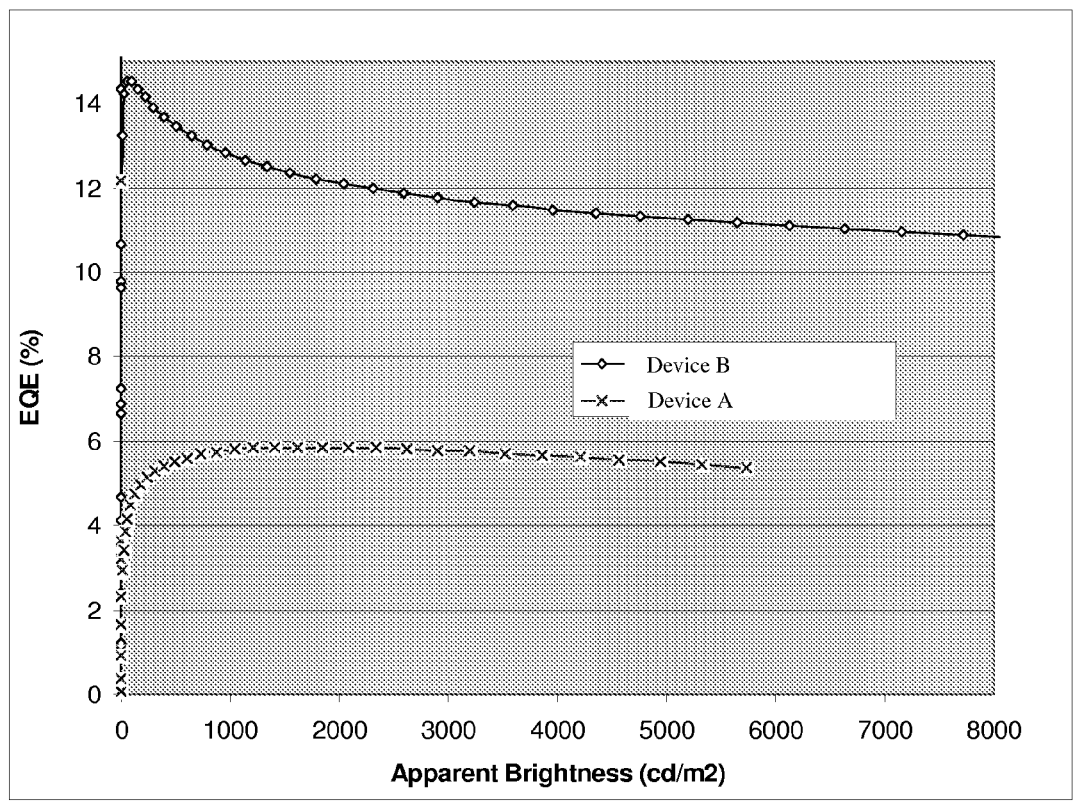
FIG. 6 provides a graph showing the external quantum efficiency versus apparent brightness for the device illustrated in FIG. 5b, and compared with a conventional OLED.
Figure 7:
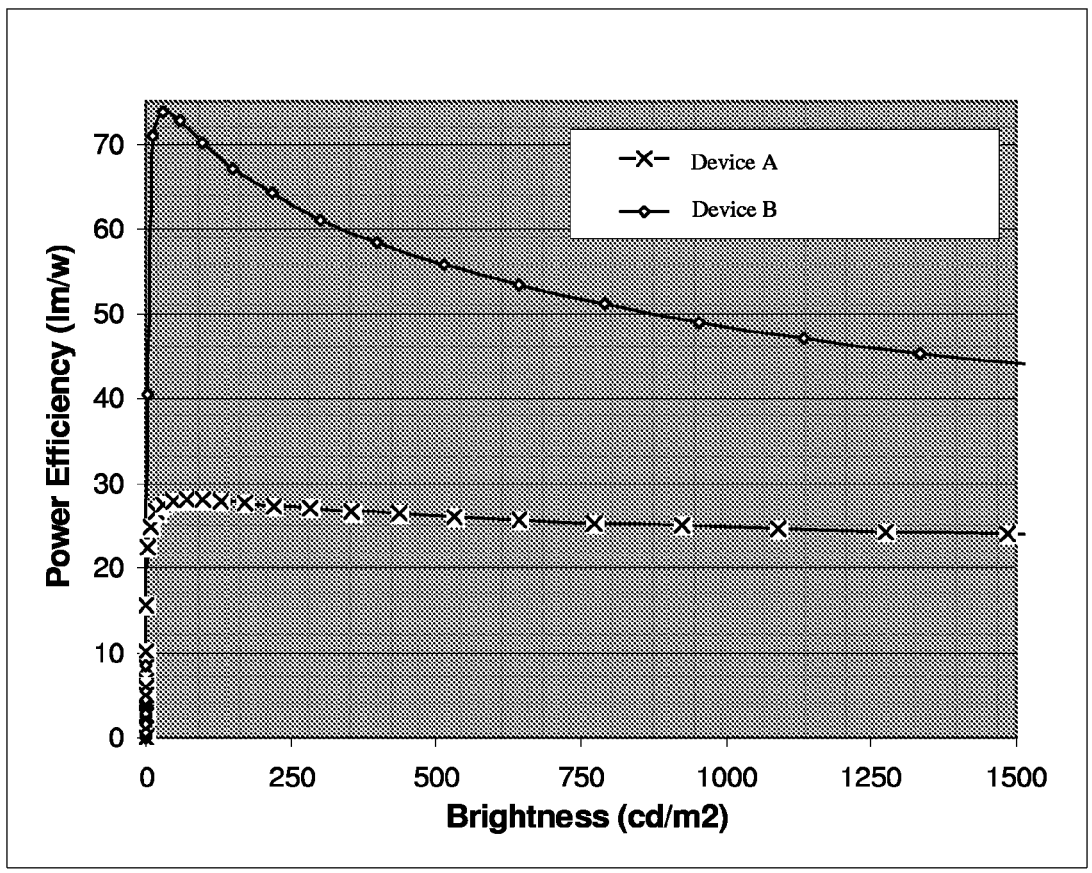
FIG. 7 provides a graph showing the power efficiency versus brightness for the device illustrated in FIG. 5b, and compared with a conventional OLED.

The device shown in FIG. 5b (having the architecture of device 400) was used to obtain the data shown in FIGS. 6 and 7. The data show that Device B (i.e., the device of FIG. 5b) performed better than Device A, a conventional OLED (i.e., an OLED lacking the optical layers described herein) as measured by EQE and power efficiency.

Example 2

Using the method described in Example 1, small-molecule OLED devices were fabricated on ITO/glass substrates using the following device configuration: PEDOT/NPB/$AlQ_3$/LiF/Al. (NPB is N,N'-bis-(3-naphthyl)-N,N'-biphenyl-(1,1'-biphenyl)-4,4'-diamine, and $AlQ_3$ is tris-(8-hydroxyquinoline)-aluminum). With this configuration, the device brightness over the vias and away from the vias was similar, primarily because the organic film thickness inside and outside the vias was the same. In some devices having non-optimal device structural parameters (i.e. cavity diameter, optical layer thickness, and wire spacing were not optimized), noticeable enhancement of EQE (by ~10%) relative to a control device using a conventional structure (i.e., using an ITO electrode and no optical or insulating layer) was observed, which is consistent with what was observed for polymer devices. It is suggested that in both cases (i.e., both the polymer and the small-molecule OLED) the electroluminescence (EL) produced directly above the insulating layer had higher efficiency than the EL produced directly over the vias.

Example 3

A device is prepared according to the following procedure.

(1) A metal thin film is deposited on to a transparent substrate by conventional thin film deposition process, such as sputtering or evaporation process.

(2) The metal grid is formed by standard photo lithography/etching process.

(3) A solution processible dielectric material, such as one selected from the preceramic polymer materials disclosed herein, polycarbonate, polyacrylate, etc., is coated by conventional coating methods (such as spin-coating, doctor-blade coating, spray coating, etc.).

(4) A lithography/etching process is used to open the vias.

Alternatively to the above procedure, Steps 1 and 2 can be replaced with a single step of printing (screen printing or ink-jet printing) the grid metal electrode using a metallic ink.

What is claimed is:

1. An electroluminescent device comprising:
   a substrate comprising a transparent material;
   an optical layer comprising a transparent optical material, wherein the optical layer contacts the substrate;
   a first electrode contacting the substrate, the optical layer, or both the substrate and the optical layer;
   one or more vias forming channels through the optical layer to the first electrode;
   a conducting layer comprising a conducting material, wherein the conducting material at least partially fills the one or more vias such that the conducting material contacts the first electrode, and further wherein the conducting layer overlays the optical layer;
   an electroluminescent layer contacting the conducting layer; and
   a second electrode contacting the electroluminescent layer.

2. The electroluminescent device of claim 1, wherein the first electrode is patterned and comprises a grid of intersecting wires.

3. The electroluminescent device of claim 2, wherein the wires comprise a bottom surface that is facing in the direction of the substrate, a top surface that is facing in the direction opposite the substrate, and two side surfaces connecting the top and bottom surfaces.

4. The electroluminescent device of claim 3, wherein the top and side surfaces of the wires meet to form edges that contact or are embedded within the optical layer.

5. The electroluminescent device of claim 4, wherein the vias form a network of connected channels that mimics the grid pattern of the first electrode.

6. The electroluminescent device of claim 5, wherein the channels expose at least a portion of the top face of the wires such that the conducting material in the vias contacts the exposed portion of the wires.

7. The electroluminescent device of claim 1, wherein the first electrode comprises a grid of interconnected wires, wherein the grid comprises: a first set of substantially parallel wires spaced apart by a first predetermined amount; and a second set of substantially parallel wires spaced apart by a second predetermined amount, and wherein wires from the first set intersect with wires from the second set to form a plurality of intersection points.

8. The electroluminescent device of claim 7, wherein the wires have an average width, and wherein the intersection points have an average diameter.

9. The electroluminescent device of claim 7, wherein the average width of the vias is smaller than the average width of the wires, or wherein the average width of the vias is substantially equal to the average width of the wires, or wherein the average width of the vias is greater than the average width of the wires.

10. The electroluminescent device of claim 1, wherein the second electrode is selected from a patterned layer and an un-patterned layer.

11. A method for forming an electroluminescent device comprising:
    providing a transparent substrate;
    forming a patterned first electrode on the substrate;
    depositing an optical material over the patterned first electrode and substrate;
    forming a pattern of vias in the optical material by removing optical material such that at least a portion of the first electrode is exposed;
    depositing a conductive material over the optical material and in the vias such that the conductive material contacts the first electrode through the vias;
    depositing an electroluminescent material over the conducting material; and
    depositing a second electrode over the electroluminescent material.

12. The method of claim 11, wherein the patterned first electrode is formed in two steps comprising: (a) depositing a substantially uniform layer of conducting material; and (b) selectively removing conducting material from the uniform layer to form a pattern.

13. The method of claim 11, wherein the first electrode comprises wires having a top surface, two side surfaces, and an edge at the intersection of the top surface and each side surface.

14. The method of claim 13, wherein the vias expose at least a portion of the top surface of the wires, but do not expose the edges of the wires, such that when the conducting material is deposited within the vias, the conducting material does not contact the edges of the wires.

15. The method of claim 13, wherein the vias expose the entire top surface of the wires.

16. The method of claim 11, wherein the patterned first electrode is formed in a single step by depositing a conducting material in a pattern.

17. The method of claim 11, wherein the method further comprises forming a pattern of channels in the substrate prior to forming the patterned first electrode, and subsequently forming the patterned first electrode such that the first electrode is disposed at least partially within the channels in the substrate.

18. The method of claim 11, wherein the first and second electrodes comprise a non-transparent material.

19. A method for forming an electroluminescent device comprising:
- providing a transparent substrate;
- depositing a first portion of optical material over the substrate;
- optionally forming a pattern within the optical material by removing a fraction of the optical material;
- forming a patterned first electrode on the first portion of optical material;
- depositing a second portion of optical material over the first portion and over the first electrode;
- forming a pattern of vias in the second portion of optical material by removing optical material such that at least a portion of the first electrode is exposed through the vias;
- depositing a conductive material over the optical material and in the vias such that the conductive material contacts the first electrode through the vias;
- depositing an electroluminescent material over the conducting material; and
- depositing a second electrode over the electroluminescent material.

20. The method of claim 19, wherein the first electrode comprises wires having two or more edges, and wherein the two or more edges are embedded within the optical material such that they do not contact the conducting material disposed in the vias.

21. The method of claim 19, wherein the first electrode comprises wires having two or more edges, and wherein the two or more edges contact both the optical material and the conducting material disposed in the vias.

* * * * *